(12) United States Patent
Pickett et al.

(10) Patent No.: US 8,779,848 B2
(45) Date of Patent: Jul. 15, 2014

(54) TWO TERMINAL MEMCAPACITOR DEVICE

(75) Inventors: Matthew D. Pickett, San Francisco, CA (US); Julien Borghetti, Mountain View, CA (US); Jianhua Yang, Palo Alto, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 109 days.

(21) Appl. No.: 13/383,981

(22) PCT Filed: Aug. 28, 2009

(86) PCT No.: PCT/US2009/055401
§ 371 (c)(1),
(2), (4) Date: Jan. 13, 2012

(87) PCT Pub. No.: WO2011/025495
PCT Pub. Date: Mar. 3, 2011

(65) Prior Publication Data
US 2012/0146184 A1    Jun. 14, 2012

(51) Int. Cl.
*G11C 11/00*    (2006.01)
*G11C 11/24*    (2006.01)
*H01L 29/167*   (2006.01)
*H01L 49/02*    (2006.01)

(52) U.S. Cl.
CPC .............. *G11C 11/24* (2013.01); *H01L 29/167* (2013.01); *H01L 28/40* (2013.01)
USPC ............................ 327/554; 257/532; 365/149

(58) Field of Classification Search
CPC ......... H01L 28/00; H01L 29/00; G11C 11/24
USPC ........... 365/149; 257/532; 327/551–559, 336, 327/337
See application file for complete search history.

(56) References Cited

U.S. PATENT DOCUMENTS

| | | | |
|---|---|---|---|
| 7,151,881 B2 * | 12/2006 | West et al. ...................... | 385/129 |
| 8,493,138 B2 * | 7/2013 | Strachan et al. ............... | 327/554 |
| 2009/0163826 A1 | 6/2009 | Mouttet | |
| 2009/0184393 A1 | 7/2009 | Chen et al. | |
| 2011/0051310 A1 * | 3/2011 | Strachan et al. ............... | 361/281 |
| 2012/0039114 A1 * | 2/2012 | Bratkovski et al. ............ | 365/149 |

FOREIGN PATENT DOCUMENTS

JP         2008-182154        8/2008
WO    WO 2010147588 A1 *  12/2010

OTHER PUBLICATIONS

Wikimedia Foundations, Inc., A Non-Profit Organization; "Schottky barrier"; http://en.wikipedia.org/wili/Schottky_barrier.
Zhirnov, Victor V., et al.; "Charge of the heavy brigade"; Nature Nanotechnology; Jul. 2008; vol. 3; Macmillan Publishers Limited.
International Preliminary Report on Patentability, Mar. 8, 2012, PCT Patent Application No. PCT/US2009/055401, The Intl Bureau of WIPO, Switzerland.

* cited by examiner

*Primary Examiner* — Telly Green

(57) ABSTRACT

A memcapacitor device includes a memcapacitive matrix interposed between a first electrode and a second electrode. The memcapacitive matrix includes deep level dopants having a first decay time constant and shallow level dopants having a second decay time constant. The second decay time constant is substantially shorter than the first decay time constant. The capacitance of the memcapacitor device depends upon an initial voltage applied across the memcapacitive matrix and a time dependent change in capacitance of the memcapacitor device depends upon the first decay time constant. A method for forming a memcapacitive device is also provided.

20 Claims, 5 Drawing Sheets

TWO TERMINAL MEMCAPACITOR DEVICE

BACKGROUND

The presence of dopants within an insulating or semiconducting matrix can dramatically alter the electrical characteristics and behavior of a device which incorporates the matrix. Dopants can be electron donors or acceptors which provide additional charge carriers within the matrix. These charge carriers add energy levels within an energy band gap of the semiconducting matrix. The presence of these dopants in the matrix may allow for alteration of certain important electrical characteristics of the device containing the matrix. For example, the dopants may be used to alter the width of a space charge region, which changes the capacitance of the device. The device may retain a "memory" of this capacitance for a period of time.

Devices which exhibit a "memory" of past electrical conditions based on changes in capacitance are called "memcapacitors" or "memcapacitive devices." Memcapacitive behavior is most strongly evident in nanometer scale devices, where conventional driving voltages can produce large electric potential gradients across the nanometer scale device. These memcapacitors could potentially be used for high density data storage, circuit calibration, or to provide self programming, fuzzy logic, or neural learning capabilities.

BRIEF DESCRIPTION OF THE DRAWINGS

The accompanying drawings illustrate various embodiments of the principles described herein and are a part of the specification. The illustrated embodiments are merely examples and do not limit the scope of the claims.

Throughout the drawings, identical reference numbers designate similar, but not necessarily identical, elements.

DETAILED DESCRIPTION

Figure 1:
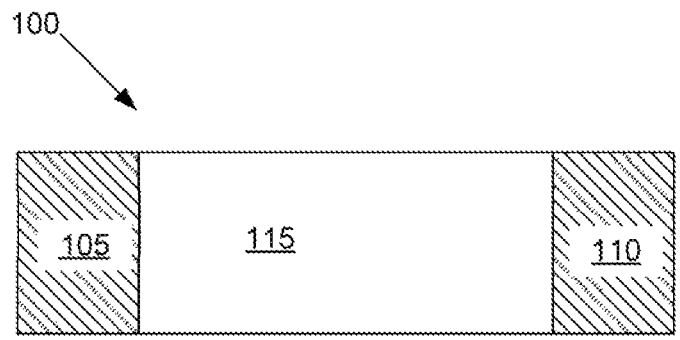
FIG. 1 is a diagram of an illustrative memcapacitor device in a low capacitance state, according to one embodiment of principles described herein.

There is a long felt but unfulfilled need for electrical components which retain a memory of past conditions. For example, these electrical components could be used to store data, calibrate circuits, or provide self programming, fuzzy logic, or neural learning capabilities. An example of such an electrical component may be a solid state memory device with high storage density, no power requirement for long term data retention, and fast access times. Examples of systems which could benefit from a retained memory of past conditions may include: switching devices; self programming circuit elements; memory devices capable of multi-state storage; solid state elements which can be used to tune circuits; analog neuronal computing devices which share fundamental functionalities with the human brain; and electronic devices for applying fuzzy logic processes.

As described below, a reprogrammable device with a memory of past electrical conditions can be formed from a matrix with implanted deep level dopants. The selective injection of charges into deep level dopants alters the capacitance of the reprogrammable device. The trapped charges and the resulting capacitance remain substantially stable over a desired time period and provide a memory of the electrical conditions used to inject the charges. Trap filling can be significantly faster than trap emptying because the filling process is activated by the large local electrical field present in nanoscale devices.

According to one illustrative embodiment, a reprogrammable device which retains a memory of past electrical conditions as a change in capacitance may be called a "memcapacitive device" or "memcapacitor." The term "memcapacitor" is derived from the combination of the two terms "memory" and "capacitor."

In the following description, for purposes of explanation, numerous specific details are set forth in order to provide a thorough understanding of the present systems and methods. It will be apparent, however, to one skilled in the art that the present apparatus, systems and methods may be practiced without these specific details. Reference in the specification to "an embodiment," "an example" or similar language means that a particular feature, structure, or characteristic described in connection with the embodiment or example is included in at least that one embodiment, but not necessarily in other embodiments. The various instances of the phrase "in one embodiment" or similar phrases in various places in the specification are not necessarily all referring to the same embodiment.

The presence of dopants within an insulating or semiconducting matrix can dramatically alter the electrical characteristics of the memcapacitive device. For example, dopants can be introduced into a matrix to alter the density of free charge carriers and thus the electrical characteristics of the device. In some circumstances, the dopants can include deep-level donors or acceptors whose energy levels are positioned deep within the energy band gap of the matrix material. Upon application of a programming electric field, charges can be injected into or removed from the deep level dopants. After removal of the electrical field or voltage pulse, the deep levels can remain ionized and maintain a fixed charge. According to one illustrative embodiment, the stability of the charges within the deep level dopants can be predicted using a decay constant of the deep level dopants. The system can be designed such that the decay constant of the deep level dopants allows the characteristics of the device to remain substantially stable for a desired period of time or until the application of another programming electrical field.

This allows the memcapacitor to "remember" how much voltage was previously applied and for how long. The filling of these dopants modulates the electrical capacitance of the memcapacitor. The dopants remain filled over long periods of time, thereby retaining a memory of the past electrical fields applied to the device. Until another electrical field is applied to the memcapacitor which has sufficient intensity or duration to induce other dopants to be filled, or until the decay time constant of these dopants reaches a certain point, the capacitance characteristics of the memcapacitor are substantially stable.

As used in the present specification and appended claims, the terms "memcapacitor" and "memcapacitive" are used to describe a combination of an insulating/semiconductor matrix and a dopant which is fixed within the matrix, and contains deep-level dopants that are neutralized or ionized in the presence of a programming electrical field and maintains the desired long term stability within the matrix when the programming field is removed. The memcapacitive effect is most strongly evident in nanometer scale devices and allows the device to "remember" past electrical conditions. The memcapacitive matrix may be made up of a variety of semiconducting materials, including nanocrystalline or amorphous materials. Such materials may include, but are not limited to, silicon, germanium, gallium arsenide, indium nitride, carbon or titanium dioxide.

As used in the present specification and appended claims, the term "dopant" refers to impurities deposited, injected, or otherwise incorporated in a material that provide electrons or electron "holes", respectively, in order to provide more energy levels in the energy band gap between the valence band and conduction band. Shallow-level dopants, or shallow dopants, refer to dopants that have energy levels close to the conduction band edge. Deep-level dopants, or deep dopants, refer to dopants that have energy levels farther from the conduction band and deeper in the energy band gap. A variety of matrix/dopant combinations could be used to form a memcapacitor with deep level dopants. For example, in a silicon matrix, the deep level dopants iron, nickel, copper, gold, silver, other transition metals, and various other species can produce deep levels. As another example, in a germanium matrix, the dopants gold, cobalt, vanadium, nickel, molybdenum, most transition metals, and other species can produce deep levels. As another example, in a gallium arsenide matrix, the dopants nickel, copper, iron, selenium, chromium, oxygen and other species can produce deep levels.

The combination of deep level dopants and shallow level dopants can create a bi-stable capacitance within a memcapacitive device. The concentration of the shallow level dopants sets the zero-bias width of the depletion region and the modulation of the charge of the deep level dopants varies the width of the depletion region. This variation in the width of the depletion region produces two or more capacitance states.

In one embodiment, the shallow level dopants may be electron donors and the deep level dopants may be electron acceptors. Due to their short time constants, the shallow level dopants quickly revert to their positive ionic state after the application of a programming voltage. However, the deep level dopants can be programmed to have a negative or neutral charge over relatively long periods of time. The charge of the deep level dopants alters the depletion region and changes the capacitance of the device. Similarly, the shallow level dopants may be electron acceptors and the deep level dopants may be electron donors.

FIG. 1 shows an illustration of a memcapacitor (100) in a high capacitance state which corresponds to thermal equilibrium. The memcapacitor (100) may include a p-n junction or a Schottky barrier. The memcapacitor (100) includes first and second conducting electrodes (105, 110) separated by a semiconductor or insulator material. The semiconductor material in this embodiment may include a memcapacitive matrix (115). As previously mentioned, the matrix (115) includes dopants that are fixed within the matrix (115) and the dopants provide charge carriers for the matrix (115). The memcapacitor (100) of the present specification utilizes the unique properties that impurities can provide a semiconducting device in order to allow the device to have memory capabilities.

The dopant, or impurity, is introduced into the matrix (115) by any method for incorporating impurities into another material, including ion implantation, introducing the impurities during fabrication, diffusion, or any other suitable process. The impurities alter the electrical properties of the material into which they are introduced, including potentially modifying the band gap between the material's valence and conduction bands. The dopants introduce new energy levels in the energy band structure so that charge carriers can occupy energy states within the forbidden semiconductor energy band gap. The dopant or dopants may be chosen according to the desired application.

The memcapacitive matrix (115) may include portions which have different amounts of dopant added, depending upon the application, or the matrix (115) may be doped uniformly throughout. For example, the memcapacitive matrix (115) may have an undoped region which acts aselectrical barrier which prevents the flow of electrical current through the matrix (115).

The electrodes (105, 110) may be made of a variety of conducting materials, including, but not limited to, metals, metal alloys, metal composite materials, nano-structured metal materials, degenerately doped semiconductors, or other suitable conducting materials. The electrodes (105, 110) may also be made using one or more of the conducting materials.

Figure 2:
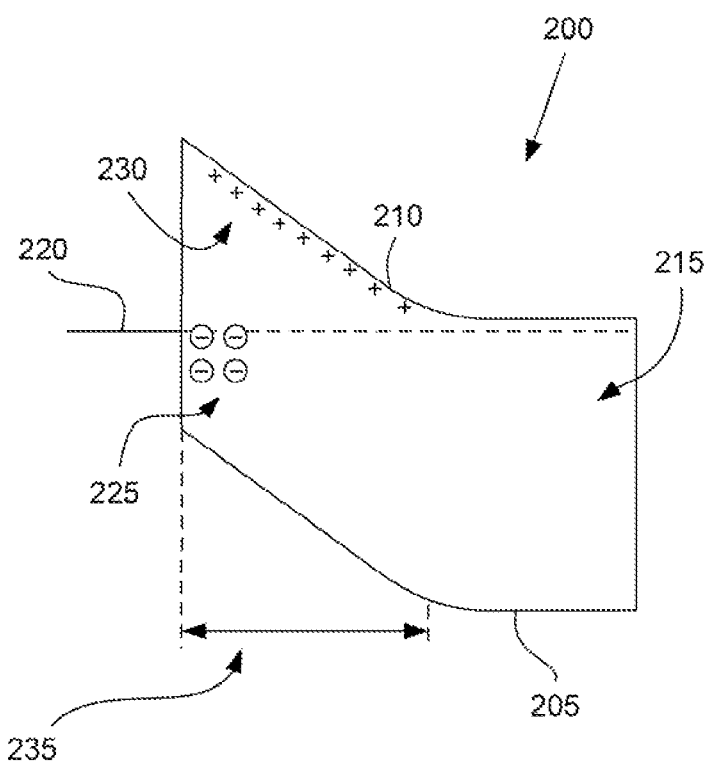
FIG. 2 is a diagram of an illustrative energy band structure within a memcapacitive matrix in a low capacitance state, according to one embodiment of principles described herein.

FIG. 2 shows an illustrative energy band structure (200) of the memcapacitive matrix (115), according to one embodiment of the memcapacitor (100). The energy bands shown include a valence band (205) and a conduction band (210). The space in between the valence band (205) and the conduction band (210) is the energy band gap (215). The horizontal line within the band gap is the Fermi energy level (220), which is relative to the conduction and valence energy levels. The Fermi level (220) may shift from its intrinsic level to a new energy level as a result of the presence of dopants in the matrix. The position of the Fermi level (200) in relation to the rest of the band structure (200) is determined by the density of dopants, both electron donors and acceptors. An electron hole is the conceptual opposite of an electron and describes the lack of an electron at a position where one could exist in an atom or lattice. In other words, a hole is a vacant spot in an otherwise full valence band (205), such that the hole may be filled by an electron. Likewise, when an electron leaves its current position in the valence band (205), a hole is created. This concept provides a simple way to analyze the electronic transitions within the valence band (205).

According to one illustrative embodiment, the deep dopants may be "donors" which donate one or more electrons to the matrix material (115) and become positively charged donors. The deep donor may be neutralized by the application of an electric field. In another embodiment, the dopants may be "acceptors" which accept one or more electrons from the matrix material (115) and become negatively charged acceptors. The trapped electron may be extracted out of the acceptor by the application of an electric field.

According to the memcapacitor (100) of the present specification, the dopants include ionized dopants that are deep-level dopants (225), in addition to possibly including shallow level dopants (230). In general, deep-level dopants (225) or shallow level dopants (230) may be physically located at any desirable location within the matrix (115). The deep-level dopant (225) is "deep" in the sense of having an energy level near the center of the band gap. While the energy levels of the shallow dopants (230) are close to the conduction band (210), the energy level of the deep dopants (225) is "deeper" in the band gap (215), i.e., closer to the valence band (205). Additionally, the shallow dopants (230) may have different electrical properties than the deep dopants (225).

Deep level dopants (225, 230) add energy levels to the band gap (215) and make it easier for electrons to exit the valence band (205) due to the lower amount of energy required to make the jump from the valence band (205) to the holes, rather than from the valence band (205) all the way to the conduction band (210). The fixed charge density that results from the presence of charged deep levels modifies the field present in the depletion region of a junction and thus the depletion width.

The memcapacitor (100) of FIG. 1 has a wide space charge region (235), as shown. The space charge region (235), or depletion region, is an insulating region within the matrix (115) where the charge carriers have diffused or have been forced away by an electric field. The space charge region (235) may have fewer free charge carriers in which to carry a current. Consequently, a voltage may be applied across the space charge region (235) without any current flow, which allows the device to be used as a capacitor. The width of the space charge region (235) controls the capacitance of the memcapacitor (100). A wider space charge region in a particular device will cause the device to have a lower capacitance than a narrow space charge region in the same device.

Figure 3:
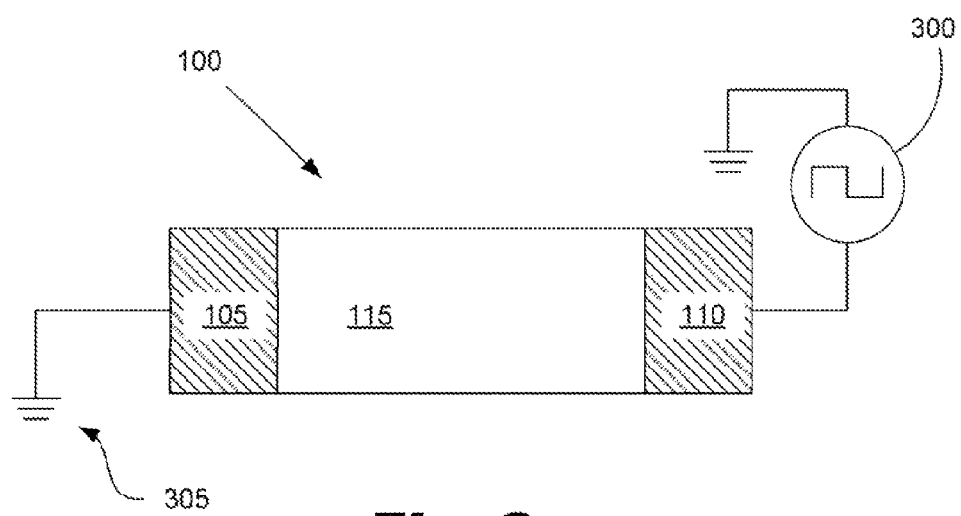
FIG. 3 is a diagram of an illustrative memcapacitor device being programmed from a low capacitance state to a higher capacitance state, according to one embodiment of principles described herein.
Figure 4:
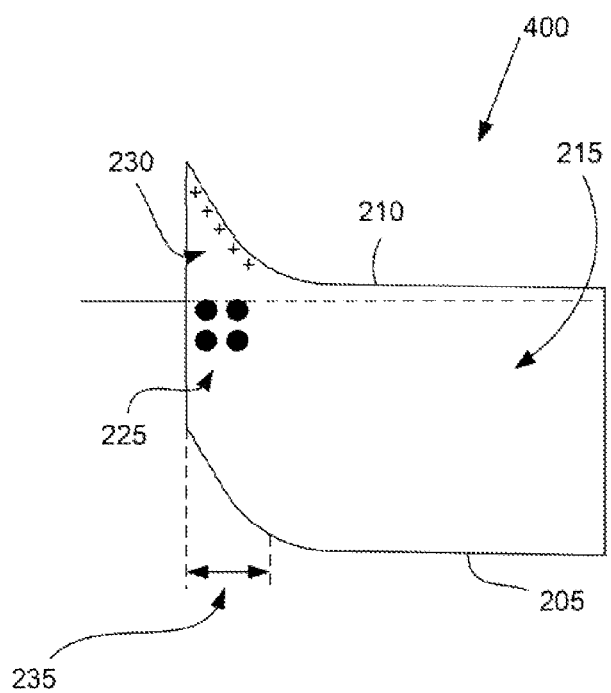
FIG. 4 is a diagram of an illustrative of an energy band structure of a memcapacitive matrix, according to one embodiment of principles described herein.

FIGS. 3 and 4 show illustrations of a memcapacitor (100) with a voltage source (300) connected to the second electrode (110), and the memcapacitor's associated band structure (400). In order to modify the zero-bias capacitance state of the memcapacitor (100), an electrical field may be applied across the memcapacitive matrix (115). This may be accomplished by applying a programming electric field across the first and second electrodes (105, 110). As shown in FIG. 3, the voltage source (300) may be applied directly to the second electrode (110), with the first electrode (105) being connected to ground (305). Alternatively, the voltage source (300) may be connected to the first electrode (105), and the second electrode (110) may be connected to ground (305) or to another portion of a larger circuit, such as to another memcapacitor or to an array of memcapacitors. Additionally, the memcapacitors may be configured in various configurations. For example, several memcapacitors may be placed either in parallel or in series, or combinations thereof, with one another. The voltage may also be a pulsed voltage, which may help use less power when setting the capacitance.

When the voltage is applied to the electrodes (105, 110), charges are removed from the dopants in the memcapacitive matrix such that the dopants are electrically neutralized, thereby decreasing the width of the space charge region (235) and increasing the capacitance. Some or all of the deep donors (225) and shallow donors (230) may be neutralized upon application of the voltage, depending on the voltage value. Higher voltages can (whether positive or negative, depending on the memcapacitor and dopant) fill more dopants than lower voltages. The applied voltage may also alter the shape of the valence band (205) and the conduction band (210) in the band structure (400).

Figure 5:
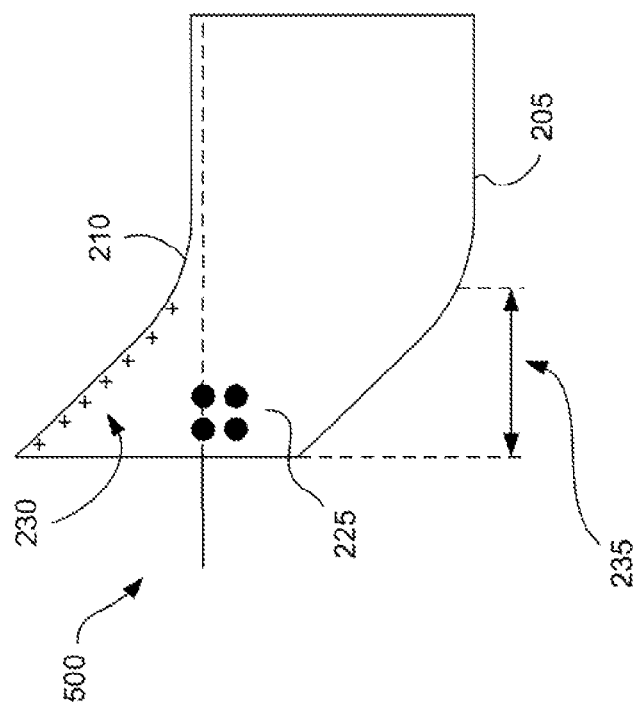
FIG. 5 is a diagram of an illustrative energy band structure within a memcapacitive matrix, according to one embodiment of principles described herein.

After applying the voltage and neutralizing the deep dopants (225), the voltage source (300) may be removed or turned off. After the voltage has been removed, the deep dopants (225) may still be neutral for a period of time due to the decay time constant of the deep dopants (225), as illustrated in the band structure (500) of FIG. 5. Because the dopants (225) remain neutral. for a characteristic period of time, the width of the space charge region (235) may be maintained for a period of time even after the voltage is removed. This results in the capacitance of the memcapacitor (100) being set at a predetermined value or within a range of values.

The period of time in which the deep dopants remain neutral (225) depends on the decay time constant or whether a second voltage is applied to the electrodes. The shallow dopants (230) may very quickly be vacated after the voltage is removed. Because of the different energy properties between the deep dopants (225) and shallow dopants (230), the deep dopants (225) also have different decay time constants than the shallow dopants (230). The deep dopants (225) typically have a longer decay time, and therefore may remain filled much longer than the shallow dopants. This property allows the memcapacitor to retain, in essence, a knowledge or memory of the capacitance established through application of the voltage. This memory of the capacitance value may allow a circuit utilizing multiple memcapacitors to store information, tune circuits, adapt neural network linkages, or perform other desirable functions such as integrated area efficient electronic filters.

After removal of the programming voltage the deep dopants (225) in the band gap (215) will retain their charge for periods that depend on their decay time constant. In this manner, the memcapacitive matrix (115) maintains the space charge region at the desired width, which also maintains the capacitance of the memcapacitor at the desired amount.

Depending on the application, the decay time constant may be long enough such that the memcapacitor (100) does not need to be periodically refreshed. For example, the memcapacitor may have a time constant of several days and is configured for use in a neural network. In such a neural network, the memcapacitor may have a medium time constant, ranging anywhere from one or more milliseconds to seconds. In other embodiments, the memcapacitor may have a longer time constant as large as weeks or months. Memcapacitors that do not need to be refreshed may consume little or no power once the voltage is removed because no bias is applied to the device.

Figure 6:
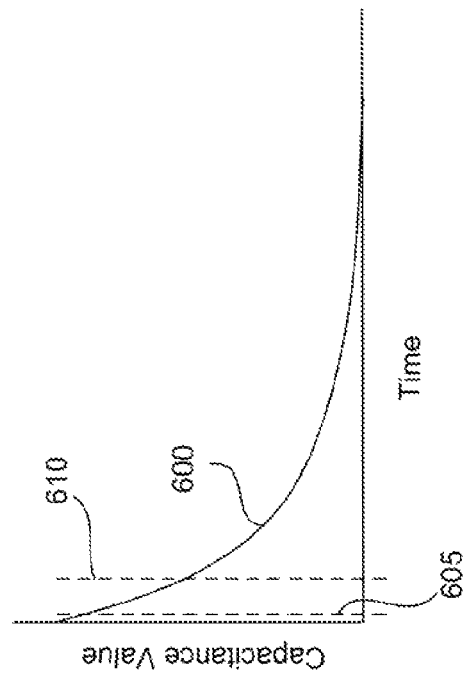
FIG. 6 is a diagram of an illustrative energy band structure within a memcapacitive matrix, according to one embodiment of principles described herein.

According to some embodiments, the memcapacitors may be refreshed in order to retain the memory of the capacitance if the capacitance needs to be held longer than the decay time constant of the devices. As such for the charge stored on the capacitance, the value of the memorized capacitance may be subject to exponential decay characterized by a time constant. Accordingly, the capacitor may be measured and the memcapacitors may be refreshed at a time period less than the time constant. For example, and by way of illustration in FIG. 6 shows a graph of capacitance value versus time. The capacitance (600) may be measured and the current signal reapplied through the electrodes such that the memcapacitor is refreshed at a fraction (605) equal to ⅒ of the time constant Other memcapacitors may be refreshed at a fraction (610) equal to ½ of the time constant, depending on the application and the particular memcapacitor device. The decay time in a particular application will determine whether or not the memcapacitor needs to be refreshed.

The type of dopant that is incorporated in the memcapacitive matrix depends on the application for which it will be used. Different materials that are suitable for being used as dopants generally have different electronic properties which may result in different decay time constants. The type of dopant to be used may be determined by the base material of the memcapacitive matrix, along with the particular application in which the memcapacitor is to be used. Additionally, two or more species of deep level dopants may be used within a memcapacitive matrix in order to obtain multiple state variable operation.

Figure 7:
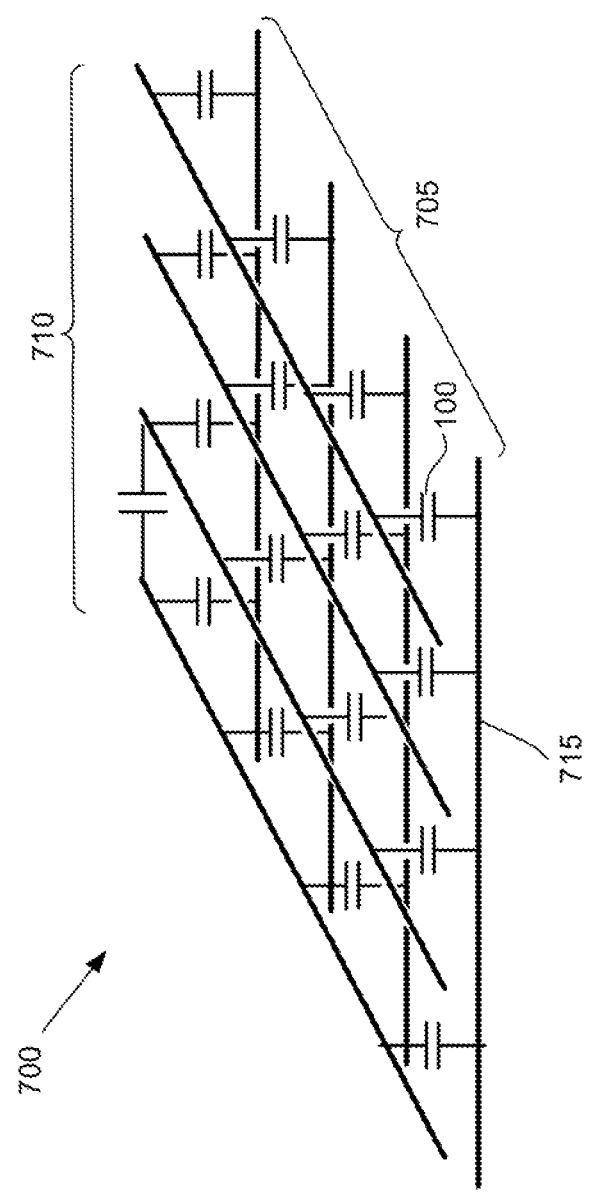
FIG. 7 is a diagram of an illustrative nanowire crossbar architecture incorporating memcapacitors, according to one embodiment of principles described herein.

FIG. 7 shows an illustration of a nanowire crossbar architecture (700) that may use the memcapacitors of the present specification. The crossbar array (700) includes a lower layer (705) of approximately parallel nanowires (715) that are overlain by an upper layer (710) of approximately parallel nanowires. The nanowires of the upper layer (710) may be generally perpendicular, in orientation, to the nanowires of the lower layer (705), although the orientation angle between the layers may be other than ninety degrees. The two layers (705, 710) of nanowires form a lattice, or crossbar, in which each nanowire of the second layer (710) overlies all of the nanowires of the first layer (705). The memcapacitors (100) may be formed between the crossing nanowires at these intersections to creating a memcapacitive junction. Memcapacitors may also be formed between nanowires in the same layer. Consequently, each wire in the upper layer is connected to every wire in the lower layer through a memcapacitive junction and visa versa. At the intersections, the upper nanowires may form the first electrode and the lower nanowires may form the second electrode. These junctions may perform a variety of functions including providing programmable switching between the nanowires. Because every wire in the first layer of nanowires intersects each wire in the second layer of nanowires, placing a memcapacitive junction at each intersection allows for any nanowire in the first layer to be selectively connected to any wire in the second layer.

Each of the memcapacitors (100) at the junctions may be individually programmed to have a certain capacitance between the upper and lower wires at each junction. According to one illustrative embodiment, the capacitance of the memcapacitor at each junction can be used to store a piece of information, which may include one or more bits of data. Different values of capacitance can represent different pieces of stored information. For example, the original capacitance value may represent a "0" and a capacitance value set using a predetermined voltage may represent a "1". According to another example, the original capacitance value may represent a set of bits, while a first set capacitance value represents a second set of bits, and a second set capacitance value represents a third set of bits. Binary or other data may be written into the architecture by changing the capacitive value of the appropriate memcapacitors.

The architecture (700) may be used to form a memory array. The memory array may be volatile, but depending on the decay time constant of each memcapacitor, the memory array may act sufficiently like a non-volatile array for the purposes of the application. Additionally, the memcapacitors may be able to store the information while using little or no power because of the decay time of the deep dopants. If the memcapacitors do need to be refreshed, the voltage may be applied to restore the capacitance value to the appropriate memcapacitors and then immediately removed when the capacitance value is set.

The memcapacitive array may be a component within an artificial neural network that is implemented in a hardware structure. An artificial neural network is made up of interconnecting artificial neurons that mimic the electrical and chemical properties of biological neurons. Neural networks may help understand the connections between neurons in a biological neural network and the operation of the biological neurons, and may also be used for solving artificial intelligence problems. The neural network may be constructed based on a mathematical or computational model that simulates the structural/function aspects of a biological neural network. The neural network may be able to exhibit learning capabilities. The memcapacitors according to the present specification may be useful in a neural network due to the memory effect of the memcapacitors when a voltage is applied to the electrodes across the memcapacitive matrix. Additionally, the low power consumption of the memcapacitors may also be very helpful in constructing large neural networks that consume very little power.

Figure 8:
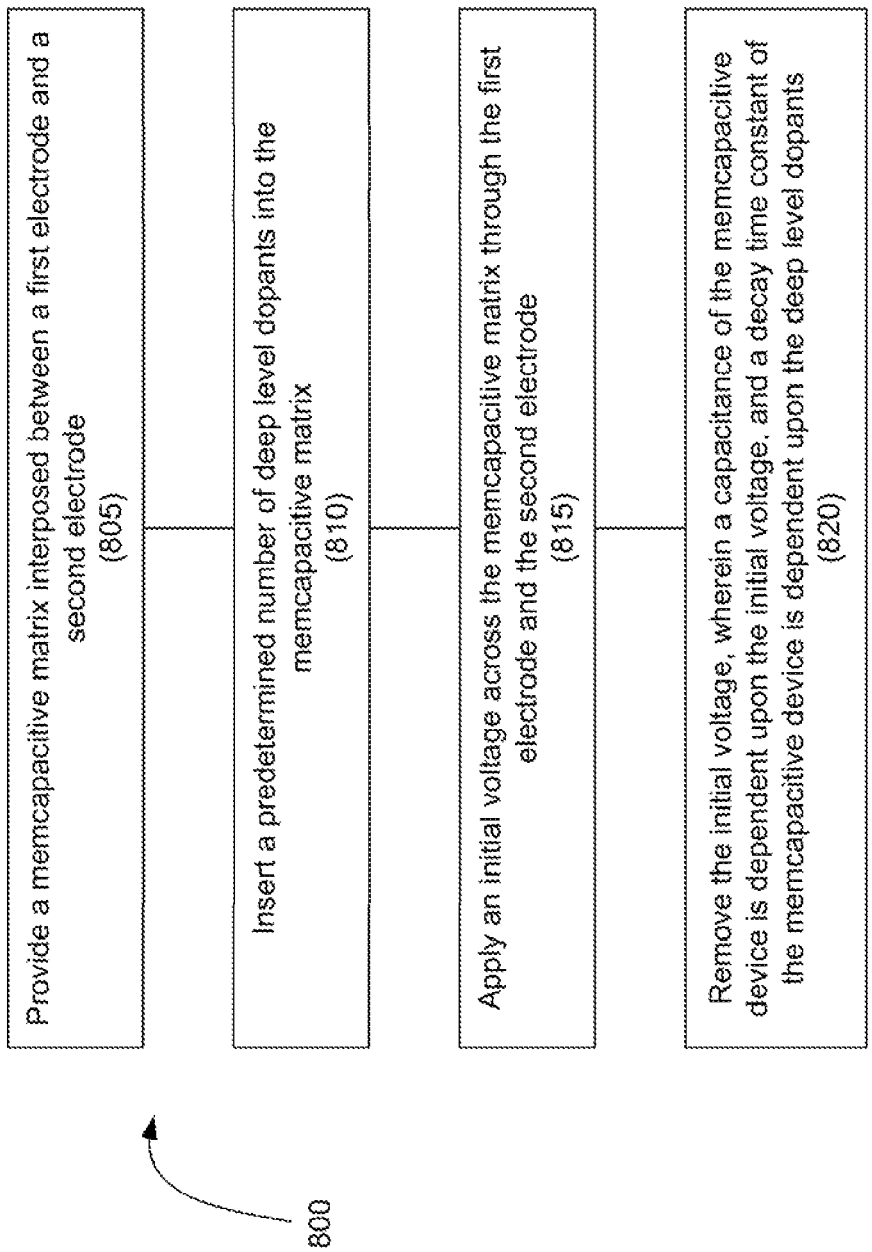
FIG. 8 is a flowchart showing one illustrative method for creating a memcapacitor device, according to one embodiment of principles described herein.

FIG. 8 shows a method (800) for creating a memcapacitive device according to the present specification. A memcapacitive matrix is provided (805) and interposed between a first electrode and a second electrode. The memcapacitive matrix may be manufactured by any process that will allow the memcapacitive matrix to exhibit the desirable characteristics as previously described. A predetermined density or number of deep level dopants is inserted (810) into the memcapacitive matrix. These dopants may be inserted into the matrix either as the matrix is created or after the matrix is created by some external process, whether by diffusion, ion implantation, or some other doping process. In some embodiments, dopants are added at the time of matrix growth, and additional dopants are added after growth during a secondary doping process. In one embodiment the concentration of deep dopants should not exceed the concentration of shallow dopants, while the concentration of shallow dopants should be chosen to control the depletion width and resulting capacitance value. A specific implementation could be an aluminum-silicon Schottky barrier based memcapacitor doped with a concentration of $10^{16}$ phosphorus (shallow donor) atoms per cubic centimeter and $10^{15}$ zinc (deep acceptor) atoms per cubic centimeter.

After the memcapacitor is constructed, an initial voltage is applied (815) across the memcapacitive matrix through the first electrode and the second electrode. The voltage may be a programming voltage that is only applied once, according to one embodiment, or the voltage may be applied several times during refresh cycles. The voltage may also be a pulsed voltage, depending on the desired application. The voltage causes the deep level dopants to be neutralized, which alters the space charge region of the device and sets the capacitance to a lower value. After applying the voltage such that the capacitance of the memcapacitor device is set, the initial voltage is removed (820). The capacitance of the memcapacitive device is dependent upon the initial voltage, and a decay time constant of the memcapacitive device is dependent upon the deep level dopants. The amount and type of deep level dopants may both affect the capacitance of the device.

In some embodiments, a second voltage having a different voltage value may be applied after the initial voltage is applied in order to change the capacitance of the device. For example a second voltage may be an erasing voltage which alters the state of the memcapacitive device. The memcapacitor may hold the capacitance due to the second voltage until a different voltage value is applied or until the decay time of the memcapacitor is reached. The decay time is dependent upon the type of dopant and where the dopants are positioned in the energy band gap of the memcapacitive matrix. Dopants that are positioned deeper in the energy band gap tend to have longer decay times than dopants that are positioned closer to the conduction or valence bands. Shallow dopants carry charges that are thermodynamically more likely to enter the conduction or valence bands than the charges in deep dopants, due to the lower amount of energy required to excite the charges in the shallow dopants to the energy level needed to enter the conduction band.

The decay time constant may induce a decay time sufficient for the memcapacitor device to be used in a neural network. Accordingly, and depending on the requirements of the neural network, the decay time may be as low as 1 millisecond, and may be as high as 1 day or several weeks or months. In order to achieve decay times of several weeks, the dopant energy level and matrix element must be chosen accordingly to the host semiconductor and the metal Fermi level. Artificial neural networks may exhibit learning functions and may be used to mimic a biological neural network, and so memcapacitors to be used in a neural network must be able to retain a "memory" of values stored in the memcapacitors for a certain period of time, depending on the application. The memcapacitors may also have relatively low static and dynamic power requirements. Some embodiments may require no static power to sustain the capacitance value because no current flows through the memcapacitors in order to maintain the capacitance value. In some embodiments, the memcapacitors might have no dynamic power consumption because the energy required to trap electrons is restituted when these trapped electrons are un-trapped. In some embodiments, the memcapacitors may be refreshed by applying the same programming voltage to the electrodes that was used to set the initial capacitance value.

The preceding description has been presented only to illustrate and describe embodiments and examples of the principles described. This description is not intended to be exhaustive or to limit these principles to any precise form disclosed. Many modifications and variations are possible in light of the above teaching.

What is claimed is:

1. A memcapacitor device, comprising:
a first electrode and a second electrode;
a memcapacitive matrix interposed between said first electrode and said second electrode;
deep level dopants contained within said memcapacitive matrix, said deep level dopants having a first decay time constant; and
shallow level dopants contained within said memcapacitive matrix, said shallow level dopants having a second decay time constant which is substantially shorter than said first decay time constant;
in which a capacitance of said memcapacitor device depends upon an initial voltage applied across said memcapacitive matrix and a time dependent change in capacitance of said memcapacitor device depends upon said first decay time constant.

2. The device of claim 1, in which said deep level dopants are electron donors and said shallow level dopants are electron acceptors, such that ionization of said deep level dopants results in a wider depletion region in said memcapacitive matrix and a lower capacitance of said memcapacitive device.

3. The device of claim 1, in which said deep level dopants are electron acceptors and said shallow level dopants are electron donors, such that ionization of said deep level dopants results in a narrower depletion region in said memcapacitive matrix and a higher capacitance of said memcapacitive device.

4. The device of claim 1, in which a number of shallow level donors is greater than a number of deep level donors.

5. The device of claim 1, further comprising a second voltage applied across said memcapacitive matrix, said second voltage being a refreshing voltage configured to restore said capacitance of said memcapacitive device.

6. The device of claim 1, further comprising a second voltage applied across said memcapacitive matrix, said second voltage being an erasing voltage configured to set said capacitance of said memcapacitive device to a new value.

7. The device of claim 1, further comprising two or more species of deep level dopants within said memcapacitive matrix such that said memcapacitive device is configured for multiple state variable operation.

8. The device of claim 1, in which said first electrode comprises aluminum and said memcapacitive matrix comprises silicon, an aluminum-silicon matrix Schottky barrier being formed at an interface between said first electrode and said memcapacitive matrix, said memcapacitive matrix comprising zinc deep acceptor dopants with a first concentration and phosphorus shallow donor atoms with a second concentration, said second concentration being approximately one order of magnitude greater than said first concentration.

9. A method for creating a memcapacitor device, comprising:
providing a memcapacitive matrix interposed between a first electrode and a second electrode;
inserting a predetermined number of deep level dopants into said memcapacitive matrix;
applying an initial voltage across said memcapacitive matrix through said first electrode and said second electrode; and
removing said initial voltage,
in which a capacitance of said memcapacitor device is dependent upon said initial voltage, and a decay time constant of said memcapacitor device is dependent upon said deep level dopants.

10. The method of claim 9, further comprising selecting a matrix/ deep level dopant combination to achieve a desired capacitive decay time constant.

11. The method of claim 9, further comprising selecting a concentration of shallow level dopants to achieve a desired zero-bias width of a depletion region.

12. The method of claim 9, further comprising selecting a concentration of deep level dopants which is lower than said concentration of shallow level dopants such that a desired modulation of a width of said depletion region is achieved through ionization of said deep level dopants.

13. The method of claim 9, in which said capacitance is configured to change when a second voltage is applied across said memcapacitive matrix.

14. The method of claim 9, further comprising applying a second voltage across said memcapacitive matrix such that said capacitance of said memcapacitor device is altered by changing a number charges trapped within said deep level dopants.

15. A neural network, comprising:
a plurality of memcapacitive devices, each comprising:
a first electrode and a second electrode;
a memcapacitive matrix interposed between said first electrode and said second electrode;
a predetermined amount of deep level dopants contained within said memcapacitive matrix; and
a variable capacitance of said memcapacitive devices is dependent upon a voltage applied across said memcapacitive matrix, in which a decay time constant of said memcapacitive devices depends upon a type and amount of said deep level dopants.

16. The device of claim 1, in which said memcapacitive matrix comprises:
a valence band;
a conduction band;
an energy band gap between said valence band and said conduction band;
in which said shallow level dopants comprise energy levels in said energy band gap close to a conduction band edge and said deep level dopants comprise dopants that have energy levels deeper in said energy band gap and farther from said conduction band edge than said shallow level dopants.

17. The device of claim 1, further comprising a depletion region, in which ionization of said deep level dopants alters a width of said depletion region to change said capacitance of said memcapacitor device.

18. The device of claim 1, in which said deep level dopants and said shallow level dopants create a bi-stable capacitance within said memcapacitive device with a concentration of said shallow level dopants defining a zero-bias width of a depletion region and modulation of a charge of said deep level dopants determines a width of said depletion region, in which variation in a width of said depletion region produces at least two capacitance states.

19. The device of claim 1, in which said shallow level dopants and deep level dopants are fixed in said memcapacitive matrix and said first decay time constant describes changes in ionization of said deep level dopants.

20. The method of claim 9, in which applying said initial voltage comprises ionizing said deep level dopants to set a width of a depletion region in said memcapacitive matrix, thereby setting said capacitance of said memcapacitive device.

* * * * *

UNITED STATES PATENT AND TRADEMARK OFFICE
CERTIFICATE OF CORRECTION

PATENT NO.         : 8,779,848 B2
APPLICATION NO.    : 13/383981
DATED              : July 15, 2014
INVENTOR(S)        : Matthew D. Pickett et al.

It is certified that error appears in the above-identified patent and that said Letters Patent is hereby corrected as shown below:

In the Specification

In column 4, line 22, delete "aselectrical" and insert -- as an electrical --, therefor.

In column 6, line 50, delete "illustration" and insert -- illustration, --, therefor.

In the Claims

In column 10, line 28, in Claim 10, delete "matrix/ deep" and insert -- matrix/deep --, therefor.

Signed and Sealed this
Sixth Day of January, 2015

Michelle K. Lee
*Deputy Director of the United States Patent and Trademark Office*